United States Patent
Radu et al.

(10) Patent No.: US 8,263,475 B2
(45) Date of Patent: Sep. 11, 2012

(54) METHOD FOR MANUFACTURING HETEROSTRUCTURES

(75) Inventors: Ionut Radu, Crolles (FR); Oleg Kononchuk, Theys (FR); Konstantin Bourdelle, Crolles (FR)

(73) Assignee: Soitec, Bernin (FR)

( * ) Notice: Subject to any disclaimer, the term of this patent is extended or adjusted under 35 U.S.C. 154(b) by 217 days.

(21) Appl. No.: 12/747,099

(22) PCT Filed: Jan. 27, 2009

(86) PCT No.: PCT/EP2009/050878
§ 371 (c)(1),
(2), (4) Date: Jun. 9, 2010

(87) PCT Pub. No.: WO2009/095380
PCT Pub. Date: Aug. 6, 2009

(65) Prior Publication Data
US 2010/0264458 A1    Oct. 21, 2010

(30) Foreign Application Priority Data
Jan. 29, 2008    (FR) .................................... 08 50534

(51) Int. Cl.
*H01L 21/30* (2006.01)
(52) U.S. Cl. ................. 438/455; 438/458; 257/E21.328
(58) Field of Classification Search .......... 438/455–459; 257/E21.328
See application file for complete search history.

(56) References Cited

U.S. PATENT DOCUMENTS

| | | | |
|---|---|---|---|
| 5,658,809 A | 8/1997 | Nakashima et al. | 438/766 |
| 6,103,009 A | 8/2000 | Atoji | 117/97 |
| 2003/0089950 A1 | 5/2003 | Kuech et al. | 257/352 |
| 2004/0166650 A1 | 8/2004 | Yokokawa et al. | 438/455 |
| 2008/0171443 A1 | 7/2008 | Hebras | 438/703 |

FOREIGN PATENT DOCUMENTS

| | | |
|---|---|---|
| EP | 0 675 534 | 10/1995 |
| EP | 0 779 650 | 6/1997 |
| FR | 2 911 430 | 7/2008 |

OTHER PUBLICATIONS

International Search Report, PCT/EP2009/050878, mailed May 13, 2009.
Aspar B. et al., "Smart Cut: the Technology Used for High Volume SOI wafer Production" Silicon Wafer Bonding Technology for VLSI and MEMS Applications Chapter 3 Ed. By S.S. Iyer and A.J. Auberton-Hervé, pp. 35-51, 2002.

(Continued)

*Primary Examiner* — Matthew Reames
(74) *Attorney, Agent, or Firm* — Winston & Strawn LLP (57) ABSTRACT

A method for manufacturing heterostructures for applications in the fields of electronics, optics or opto-electronics. This method includes providing a silicon oxide layer with a thickness of less than or equal to 25 nanometers on one of a donor substrate or a receiver substrate or on both substrates, heat treating the substrate(s) that contains the silicon oxide layer at 900° C. to 1,200° C. under a neutral or reducing atmosphere that contains at least one of argon or hydrogen to form layer trapping through-holes inside the silicon oxide, bonding the substrates together at a bonding interface with the silicon oxide layer(s) positioned between them, reinforcing the bonding by annealing the substrates at 25° C. to 500° C. such that the trapping holes retaining gas species at the bonding interface, and transferring an active layer as a portion of the donor substrate onto the receiver substrate to obtain the heterostructure.

17 Claims, 4 Drawing Sheets

OTHER PUBLICATIONS

Beyer V. et al., "Dissociation of $Si^{+\ Ion\ Implanted\ and\ As\mbox{-}Grown\ Thin\ SiO_2}$ Layers During Annealing in Ultra-Pure Neutral Ambient by Emanation of SiO", Journal of Applied Physics, vol. 101, pp. 053516-1-053516-6 (2007).

Esser R.H. et al., "Directional Diffusion and Void Formation at a Si (001) Bonded Wafer Interface", Journal of Applied Physics, vol. 92, No. 4, pp. 1945-1949 (2002).

Taylor S. et al., "A Review of the Plasma Oxidation of Silicon and its Applications": Semiconductor Science Technol., vol. 8, pp. 1426-1433, (1993).

METHOD FOR MANUFACTURING HETEROSTRUCTURES

This application is a 371 filing of International Patent Application PCT/EP2009/050878 filed Jan. 27, 2009.

BACKGROUND

The invention is located in the field of the manufacturing of heterostructures intended for applications in the field of electronics, optics or opto-electronics.

More specifically, it relates to a method for manufacturing such heterostructures, which comprises the steps for bonding a so-called "donor" substrate on a so-called "receiver" substrate and for transferring a layer from this donor substrate onto this receiver substrate.

The heterostructures of this type, obtained by known methods from the state of the art, have defects at the bonding interface and at the surface of the transferred layer.

Among this surface defects, are found non-transferred areas (NTAs), blisters, vacancies or voids.

These defects have various origins and notably poor quality of the bonding interface.

From the state of the art, methods are already known which have the purpose of improving the quality of this bonding. These are notably surface treatments with which any contamination may be removed before bonding. These customary techniques are compatible with the techniques for bonding wafers and allow most of the contaminants to be removed, without degrading the surface condition of the wafers.

Thus, a conventional treatment with a chemical bath known under the acronym RCA (Radio Corporation of America) consists of treating the faces of the wafers, successively with a first solution comprising a mixture of ammonium hydroxide ($NH_4OH$), hydrogen peroxide ($H_2O_2$) and deionized water, and then with a second solution comprising a mixture of hydrochloric acid (HCl), hydrogen peroxide ($H_2O_2$) and of deionized water. Another technique customarily used consists of applying a solution of hydrogen peroxide and sulfuric acid, commonly called "CARO" or further "Piranha Clean".

However these methods are not sufficient for obtaining a very good bond quality for all the heterostructures, notably when these are substrates of the Semiconductor-On-Insulator type, known under the acronym SeOI, substrates comprising a fine insulating oxide layer known under the acronym "UTBOX", (Ultra Thin Buried Oxide) or substrates which do not contain any of them, such as for example heterostructures known to the person skilled in the art under the acronym DSB (Direct Silicon Bonding) which means direct bonding on silicon.

As a reminder, it is recalled hereafter that UTBOX substrates designate SOI (Silicon On Insulator) type substrates in which the buried oxide layer is of a thickness less than or equal to 50 nm (50 nanometers), or even less than 25 nm.

DSB substrates comprise an active layer of semiconducting material directly bonded onto a receiver substrate or onto a bulk substrate which is also semiconducting, without forming an intermediate layer.

Now it is known that the number of interface defects increases significantly in the case of fine buried insulating layers. This is in connection with the capacity possessed by the buried insulating layer of absorbing water and gases existing at the bond interface: the finer this insulating layer, the less it absorbs water and the more defects are formed.

Moreover it is known from the article of V. Beyer et al., "*Dissociation of $Si^+$ ion implanted and as-grown thin $SiO_2$ layers during annealing in ultra-pure neutral ambient by emanation of $SiO_2$*", Journal of Applied Physics 101, 053516 (2007), that treating a silicon oxide ($SiO_2$) film deposited by epitaxy on a silicon substrate, by annealing at 1,150° C., in an oxygen-free argon atmosphere at ambient pressure leads to partial dissolution of the $SiO_2$ film and to the appearance of holes in this film.

However, the author is absolutely neither interested in methods for bonding and transferring layers, nor in improving the quality of this bonding.

The article of R. H. Esser et al., "*Directional diffusion and void formation at a Si (001) bonded wafer interface*", Journal of Applied Physics, Vol. 92, No. 4, Aug. 15, 2002, describes various experiments conducted on hydrophobic bonding at low temperature (400° C.) of two silicon wafers.

Tests were carried out by etching in one of the wafers to be bonded, either grids of non-opening trenches with a width of 150 μm and a depth of 2 μm over the whole length, or series of trenches aligned along the <110> direction and then by bonding it onto the other wafer and subjecting them to annealing at 400° C. for 16 hours.

The results showed disappearance of void type defects around the trenches, whereas this type of defects was visible after annealing at 400° C. on control wafers which did not include trenches.

However, with this type of trenches of very large dimensions, it is not possible to achieve a quality bond between two substrates and they cannot absolutely be applied in a layer transfer method, except by causing the occurrence of many defects or further reducing the strength of the bonding interface, the latter strength being in direct relationship with the existing contact surface area between the transferred layer and the substrate.

Further, the trenches are formed by lithography which makes the method long and difficult to carry out.

The object of the invention is to solve the aforementioned drawbacks of the state of the art and notably to provide a method with which the quality of a bonding interface may be improved in a method for manufacturing a heterostructure comprising a layer transfer step.

For this purpose, the invention relates to a method for manufacturing heterostructures for applications in the field of electronics, optics or opto-electronics.

SUMMARY OF THE INVENTION

According to the invention, this method comprises the steps of:
  forming and/or depositing a silicon oxide $SiO_2$ layer with a thickness less than or equal to 25 nanometers on a first so-called "donor" substrate and/or on a second so-called "receiver" substrate,
  submitting the substrate(s) covered with said silicon oxide layer to a heat treatment at a temperature comprised between 900° C. and 1,200° C., under an atmosphere controlled so as to contain at least one of the gases selected from argon and hydrogen, and not to contain any oxygen, in order to form inside said silicon oxide layer, so-called "trapping" through-holes,
  bonding both substrates with each other so that the silicon oxide $SiO_2$ layer(s) is(are) positioned between them,
  carrying out annealing for reinforcing the bonding interface between both substrates, at a temperature comprised between 25° C. and 500° C., said trapping holes being able to retain the gas species present at this interface, transferring a portion of the donor substrate, a so-called "active layer" onto the receiver substrate, so as to obtain said heterostructure.

By these characteristics of the invention, the formed holes are used for trapping hydrogen present at the bonding interface, so that the bonding is largely improved, and moreover the formed holes are of a sufficiently small dimension so as not to interfere with the quality of the bond and therefore with that of the transferred layer.

According to other advantageous and non-limiting characteristics of the invention, taken alone or as a combination:

the thickness of the silicon $SiO_2$ layer is less than or equal to 10 nanometers;

the heat treatment for forming the trapping holes is carried out by rapid thermal annealing of the RTA type, for a duration comprised between about 30 seconds and 2 minutes;

the heat treatment for forming the trapping holes is carried out in an epitaxy support for a duration of at least 10 minutes;

the formed trapping holes have a diameter of three micrometers at the most;

at least one of the substrates among the donor substrate and the receiver substrate is made in silicon;

the heat treatment for forming the trapping holes is followed by an etching step with acid, intended to etch the substrate supporting the silicon oxide $SiO_2$ layer facing said trapping holes, in order to increase the total depth of the latter;

the etching of the substrate supporting the silicon oxide $SiO_2$ layer is carried out with hydrochloric acid;

the $SiO_2$ silicon oxide layer is obtained by thermal oxidation of the substrate(s) on which it rests or by a technique selected from CVD type chemical vapor depositions or LPCVD type low pressure chemical vapor depositions;

the silicon oxide $SiO_2$ layer is deposited by means of a plasma under oxygen;

the transfer of the active layer comprises the formation of an embrittlement area inside the donor substrate before the step for bonding both substrates;

the silicon oxide $SiO_2$ layer is formed or deposited on the donor substrate and the step for forming the embrittlement area is carried out after the heat treatment for forming the trapping holes;

said active layer has a thickness comprised between about 25 and 500 nanometers, and in that after said heterostructure has been obtained, it is heated in an inert and/or reducing atmosphere, at a temperature comprised between about 1,100° C. and 1,300° C., for a duration comprised between about a few minutes and a few hours, so as to reduce the thickness of said silicon oxide $SiO_2$ layer;

heating is continued until the silicon oxide $SiO_2$ layer is completely removed and a heterostructure is obtained in which the active layer directly rests on the receiver substrate.

The invention also relates to a heterostructure comprising a so-called "receiver" substrate and an active layer between which is inserted, at least one oxide layer comprising holes for trapping gas species possibly present at a bonding interface of this heterostructure, the total thickness of the oxide layer(s) being less than or equal to 50 nm, the trapping holes being present in a density comprised between 0.1 and 100 holes per square centimeter of surface area of the free upper face of said oxide layer and having a diameter of less than or equal to 3 micrometers.

BRIEF DESCRIPTION OF THE DRAWINGS

Other characteristics and advantages of the invention will become apparent from the description which will now be made, with reference to the appended drawings, which illustrate as an indication but not as a limitation, several and possible embodiments thereof.

In these drawings.

DETAILED DESCRIPTION OF THE INVENTION

A first embodiment of the invention will now be described with reference to FIGS. 1A-1F.

Figure 1A:
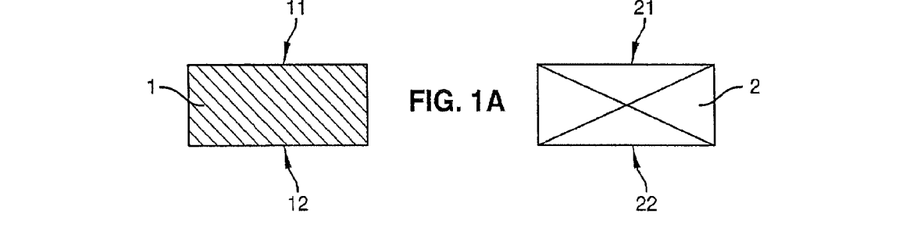
FIGS. 1A-1E are diagrams illustrating the different successive steps of a first embodiment of the method according to the invention.

A donor substrate 1 and a receiver substrate 2 may be seen in FIG. 1A.

They respectively have a front face 11, 21 and an opposite rear face 12, 22.

Both of these substrates are preferably made in a semiconducting material, for example a material selected from those currently used in the field of electronics, notably silicon.

Preferably, at least one of the two substrates 1 and 2 is in silicon, preferably the donor substrate.

Figure 1B:
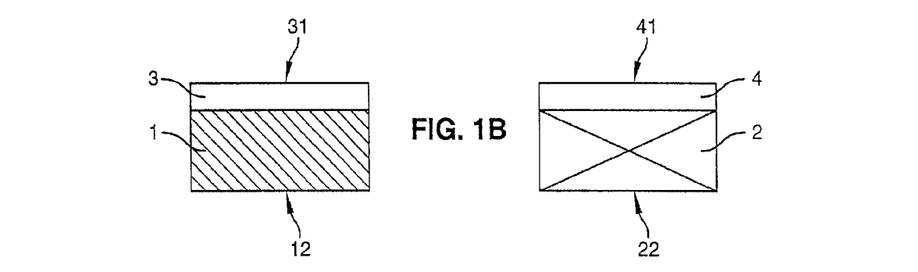

The following step illustrated in FIG. 1B consists of forming and/or depositing a silicon oxide ($SiO_2$) layer 3, on the front face 11 of the donor substrate 1, and/or a silicon oxide ($SiO_2$) layer 4 on the front face 21 of the receiver substrate 2.

The free upper face of the oxide layer 3 bears reference 31, that of the layer 4, reference 41.

For reasons which will be detailed hereafter, the thickness of each of these silicon oxide layers is less than or equal to 25 nm (25 nanometers), preferably less than or equal to 10 nm (10 nanometers).

When the oxide layer is formed, it is formed by thermal oxidation of the substrate on which it rests, this oxidation being conducted at temperatures comprised between 800° C. and 1,000° C. In this case, this substrate is mandatorily silicon.

When the silicon oxide layer is deposited, it is deposited by a deposition technique, for example selected from: chemical vapor deposition known under the acronym "CVD", low pressure chemical vapor deposition, known under the acronym "LPCVD", or atomic layer deposition method, known under the acronym "ALD", or further plasma enhanced chemical vapor deposition method known under the acronym "PECVD".

It is also possible to proceed with depositing the silicon oxide layer by the aforementioned LPCVD technique, but from a tetraethyl orthosilicate (TEOS) type precursor, this technique being known under the acronym "LPCVD TEOS".

Finally, it is also possible to deposit the silicon oxide layer by means of a plasma under oxygen. For a more detailed description of this technique, reference may be made to the Internet site: http://www.research.ibm.com/journal/rd/431/hess.html or to the article of S. Taylor et al., "*A review of the plasma oxidation of silicon and its applications*", Semicond. Sci. Technol. 8 1426-1433 (1993).

When the SiO$_2$ layer is deposited, the treated donor or receiver substrate may be in a material other than silicon.

The SiO$_2$ layer 3 and/or 4 may also be native. In the latter case, it is formed by natural oxidation of the substrate 1 and/or 2 in open air or during cleaning procedures.

Figure 1C:
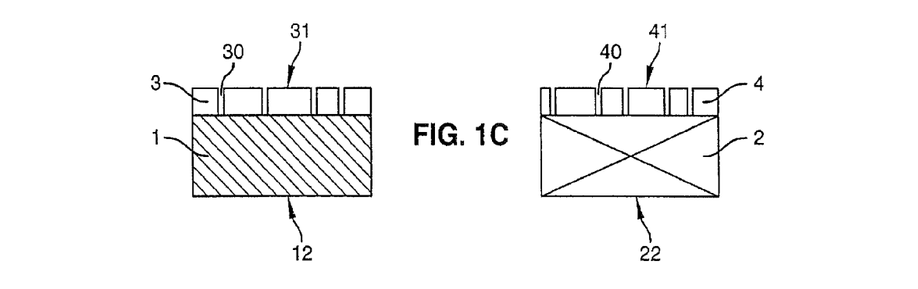

As illustrated in FIG. 1C, it is then proceeded with a heat treatment aiming at forming so-called trapping holes inside the silicon oxide layer.

The holes formed in the oxide layer 3 bear reference 30 and those formed in the oxide layer 4 reference 40.

These holes are formed by submitting the oxide layer 3 or the oxide layer 4 or both of them, if both substrates 1 and 2 are covered with oxide, to a heat treatment at a temperature comprised between 900° C. and 1,200° C., under an atmosphere monitored so as to contain at least one of the gases selected from argon and hydrogen, and not to contain any oxygen. In other words, the oven may be supplied with one of these two gases by selection or with a mixture of both.

This treatment may be carried out by rapid thermal annealing known under the acronym "RTA", in a suitable oven, for a duration comprised between about 30 seconds and 2 minutes, or else in an epitaxy support, for a duration of at least 10 minutes.

By applying this heat treatment, combined with the limited thickness of the SiO$_2$ layer (less than or equal to 25 nm as aforementioned), it is possible to create inside the latter a plurality of through-holes, with a substantially circular shape with a diameter of less than or equal to 3 μm. If the thickness of the SiO$_2$ oxide layer were larger than 25 nm, it would be more difficult to form these trapping holes.

These trapping holes are formed by local disintegration of the oxide due to diffusion of silicon through the fine SiO$_2$ layer. They are also due to instability of this fine oxide layer when its temperature is raised. These trapping holes correspond to a lack of material.

By the expression "through-holes", holes are meant which open out at one end of the free upper face 31 of the oxide layer 3 (the free upper face 41 of the layer 4 respectively), and at the other end facing the front face 11 of the donor substrate 1 (the front face 21 of the substrate 2, respectively).

The heat budget during the heat treatment for forming trapping holes and the thickness of the silicon oxide layer 3 and/or 4 are selected so as to obtain a density of holes preferably comprised between 0.1 and 100, preferentially between 1 to 10 trapping holes per square centimeter of surface area of the faces 31 or 41 of the oxide layers.

With the small dimension of the trapping holes combined with their distribution density at the surface of the oxide, it is possible not to deteriorate the quality of the bonding which occurs subsequently (see FIG. 1D).

Optionally, the treatment for forming the trapping holes is followed by an etching step with acid, intended to etch the substrate supporting the silicon oxide (SiO$_2$) layer facing said trapping holes in order to increase the total depth of the latter.

The acid will be selected in order to carry out selective etching, i.e. in order not to etch the silicon oxide but exclusively the substrate located underneath.

As an example, when the substrate supporting the oxide layer is in silicon, hydrochloric acid will be used, preferably in the gas state.

If the treatment for forming the holes is carried out in an epitaxy enclosure (support), it is then sufficient to close the argon or hydrogen supply and to introduce hydrochloric acid into the enclosure.

Figure 1D:
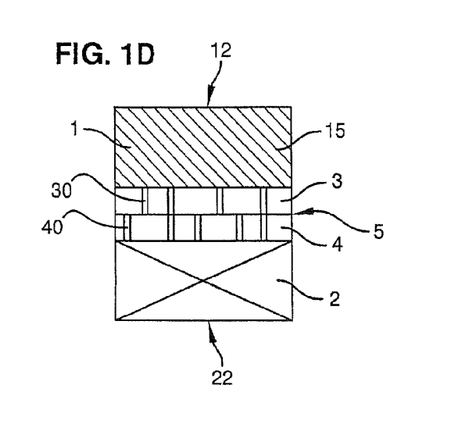

It is then proceeded with the bonding of both substrates 1 and 2 to each other, so that the silicon oxide (SiO$_2$) layer(s) 3, 4 is(are) positioned between them, as shown in FIG. 1D.

This bonding is hydrophilic, it is preferably carried out by molecular adhesion, i.e. by intimate contact of the faces 11 or 31 with the faces 21 or 41, depending on the substrate(s) on which the oxide layer(s) is(are) formed.

The bonding interface bears reference 5. In the figures, it is illustrated between the faces 31 and 41.

If only one of the two substrates 1 or 2 is covered with an oxide layer, this bonding interface then extends between the oxide layer and the facing substrate. In the latter case, it is also possible to have an insulating layer, for example in silicon nitride Si$_3$N$_4$ or further in silicon oxynitride Si$_x$O$_y$N$_z$, on the substrate which is not covered with silicon oxide, the bonding interface then extends between the SiO$_2$ layer and this insulating layer.

Next, annealing for reinforcing the bonding interface 5 is carried out at low temperature, i.e. temperatures between 25° C. and 500° C.

Gases such as for example hydrogen may form during this annealing.

The formed hydrogen is trapped in the trapping holes 30 and/or 40, which avoids the formation of gas bubbles at the bonding interface and therefore the occurrence of blisters on the rear face 12 of the donor substrate 1.

Figure 1E:
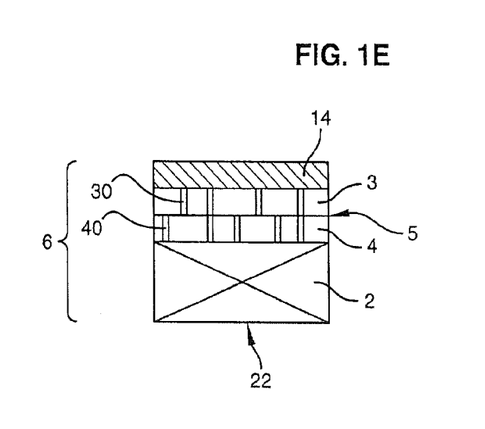

Finally, as illustrated in FIG. 1E, a rear so-called "remainder" portion of the donor substrate 1 is ground and/or polished so as to only retain a material thickness defining a so-called "active" layer 14 which is transferred onto the receiver substrate 2.

The heterostructure 6 is obtained.

A second embodiment is described with reference to FIGS. 2A-2F. The elements identical to the first embodiment bear the same numerical references and will not be described in detail again.

This second embodiment differs from the first by the method for transferring the active layer 14 onto the receiver substrate 2. The transfer is obtained by forming an embrittlement area inside the source substrate 1, the latter consisting of a porous area 13.

Figure 2A:
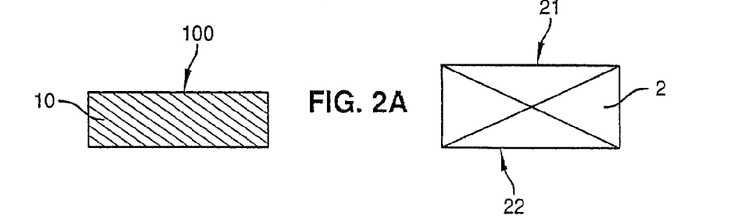
FIGS. 2A-2F and 3A-3F are diagrams illustrating the different successive steps of a second and third embodiment of this method, respectively.
Figure 2B:
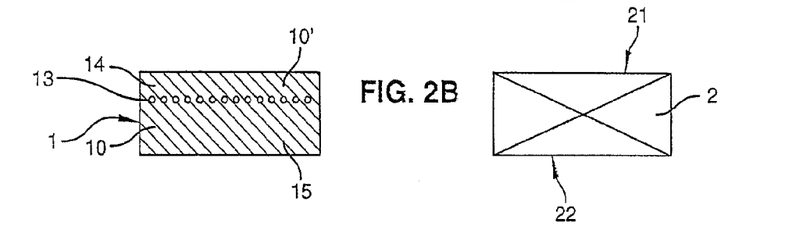
Figure 2C:
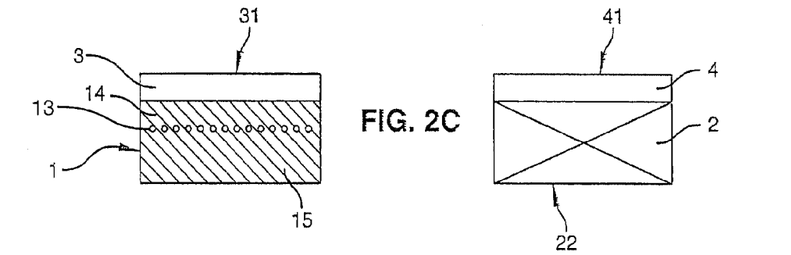
Figure 2D:
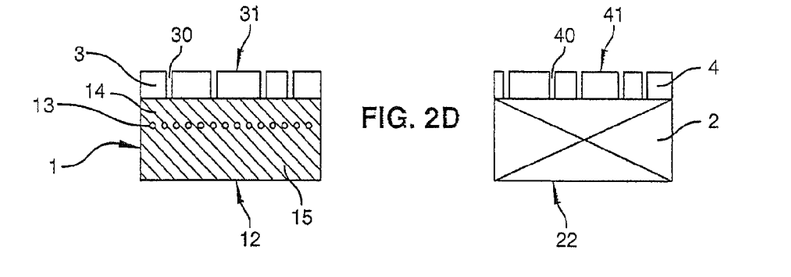

This porous area 13 may be obtained by the method known under the ELTRAN™ designation and for example it is described in the book "*Silicon wafer bonding technology for VLSI and MEMS applications*", by S. S. Lyer and A. J. Auberton-Hervé, IEE (2002).

According to this method, a first source substrate 10 undergoes a suitable treatment in order to make its upper face 100 porous, and a layer 10' is then formed on this face 100 by epitaxy, so as to obtain a buried porous area 13.

The whole defines the source substrate 1, to which the different steps of the method described in connection with FIGS. 1B-1E are then applied.

Figure 2E:
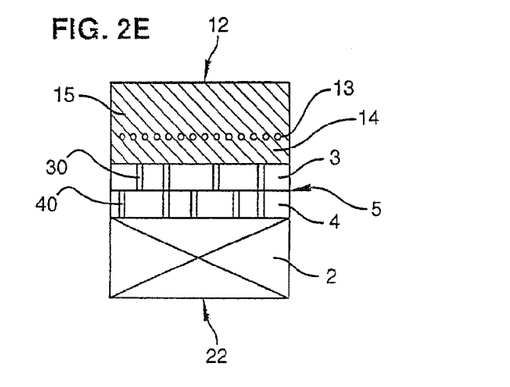
Figure 2F:
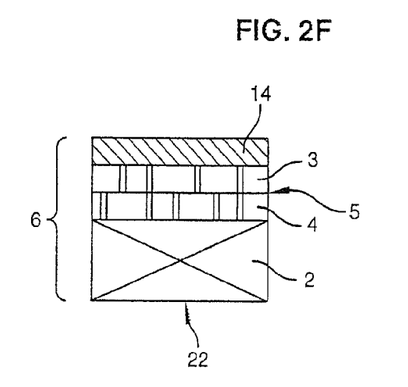

The detachment illustrated in FIG. 2F consists of applying stresses of mechanical (for example with a blade), of thermal and/or chemical origin at the porous area 13 in order to obtain the heterostructure 6.

A third embodiment is described with reference to FIGS. 3A-3H. The elements identical to the first embodiment bear the same numerical references and will not be described in detail again.

This third embodiment differs from the first by the method for transferring the active layer 14 onto the receiver substrate 2. The transfer is obtained by the formation of an embrittlement area inside the source substrate 1, the latter consisting of an implanted area 13'.

Figure 3A:
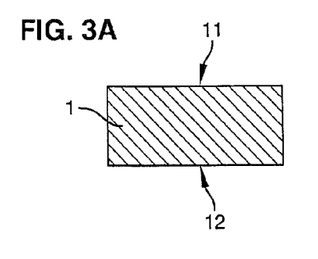
Figure 3B:
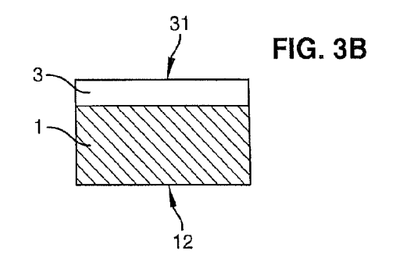

FIGS. 3A and 3B are identical to FIGS. 1A and 1B.

Figure 3C:
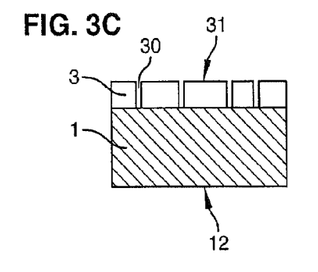
Figure 3D:
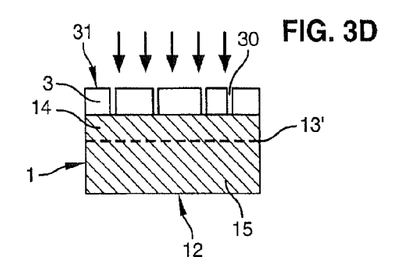

Next, as illustrated in FIGS. 3C and 3D, the heat treatment is carried out for forming the trapping holes 30 inside the SiO$_2$ layer 3, and it is then proceeded with the implantation of at least one category of atomic and/or ionic species inside the source substrate 1, preferably from its front face, in order to define the embrittlement area 13'.

By implantation of atomic and/or ionic species, is meant any bombardment of atomic and/or ionic species capable of introducing these species into the donor substrate 1, with a maximum concentration at a predetermined depth of the substrate relatively to the bombarded surface, in order to create the embrittlement area thereon.

Preferably, hydrogen or helium ions or both if this is a co-implantation, are implanted.

This method is applied in the technology known under the designation of Smart Cut™. Reference may be made on this subject to the literature concerning this method, and notably to the book "*Silicon wafer bonding technology for VLSI and MEMS applications*", by S. S. Lyer and A. J. Auberton-Hervé, IEE (2002).

According to other alternative embodiments not shown in the figures, it is also possible not to deposit the silicon oxide layer 3 on the donor substrate 1 or to deposit it thereon before the implantation allowing the embrittlement area to be formed but without forming trapping holes thereon, from the moment that, in this case, the receiver substrate 2 is covered with a silicon oxide layer which undergoes the treatment for forming the trapping holes.

Figure 3E:
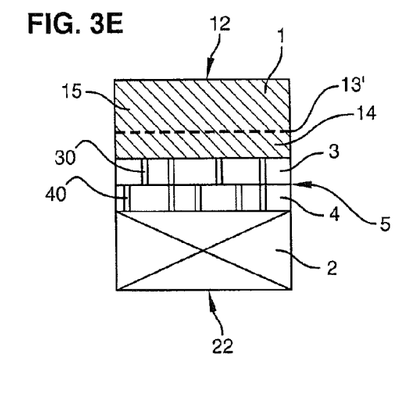
Figure 3F:
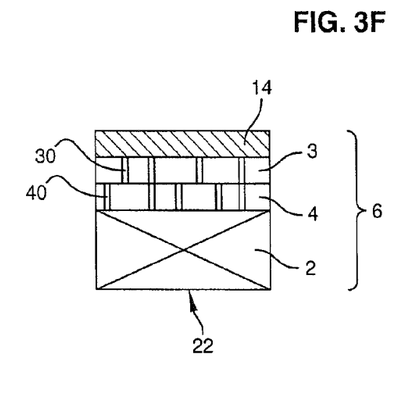

The steps for bonding both substrates and detaching the remainder 15 illustrated in FIGS. 3E and 3F are identical to what was described in connection with FIGS. 2E and 2F.

An alternative embodiment of the invention will now be described with reference to FIGS. 4A and 4B.

In this case, the heterostructure 6, obtained according to any the methods described earlier, is subjected to a heat treatment allowing its transformation into a substrate of the "UTBOX" or "DSB" type.

Figure 4A:
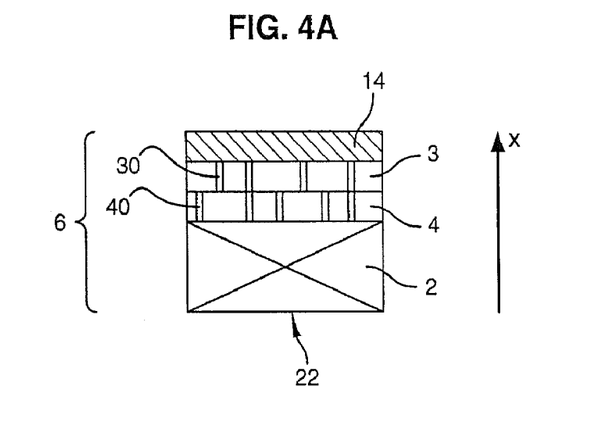
FIGS. 4A-4C are diagrams illustrating the transformation of a heterostructure obtained by one of the methods illustrated in the previous figures, into a heterostructure of the aforementioned "UTBOX" or "DSB" type.

This heat treatment is applied so that the thickness of the oxide layer 3 or 4 (or 3 and 4 if both are present as illustrated in FIG. 4A) decreases by diffusion of oxygen through the active layer 14.

This treatment is carried out in an inert and/or reducing atmosphere such as an atmosphere containing argon or hydrogen or a mixture of both.

If the active layer 14 is sufficiently thin, a portion of the oxygen of the oxide layer 3, 4 diffuses through it and evaporates into the atmosphere at its surface. This diffusion is accelerated by the fact that the atmosphere in which the reaction occurs is inert and/or reducing, or more exactly non-oxidizing.

The applicant has demonstrated that the main parameter affecting the dissolution time is the annealing temperature and the thickness of the active layer 14 and that moreover the result does not depend on the oxygen concentration in the receiver substrate 2.

Generally, the temperature and the duration of the heat treatment, as well as the thickness of the oxide layer 3, 4 and the thickness of the active layer 14 will be selected so as to incite the oxygen present in the oxide layer 3, 4 to diffuse through the active layer 14 rather than through the receiver substrate 2.

Preferably, this heat treatment or dissolution annealing is conducted under an atmosphere containing argon and/or hydrogen, at a temperature comprised between about 1,100° C. and 1,300° C., for a duration comprised between about a few minutes and a few hours. Also preferably, the active layer 14 illustrated in FIG. 4A, should have a thickness comprised between 25 and 500 nanometers, preferably between 25 and 250 nanometers, still preferably between 25 and 120 nanometers and the thickness of the silicon oxide layer 3 or 4 or the thickness of the sum of both should be comprised between 1 and 50 nanometers.

Moreover, it will be noted that the larger the thickness of layer 14, the lower is the dissolution rate of the insulating layer 3, 4. The higher the temperature of the dissolution heat treatment, the faster is dissolution.

Figure 4B:
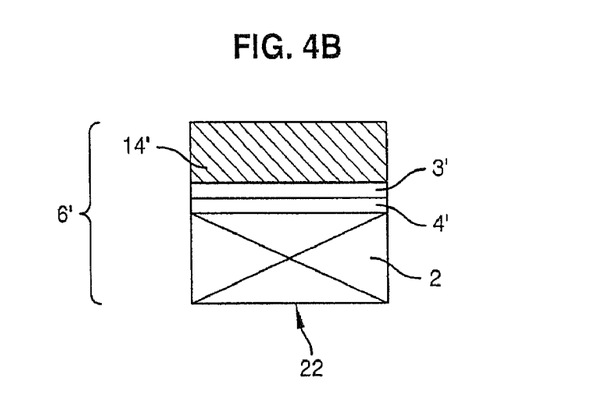

As illustrated in FIG. 4B, the treatment may be continued until partial dissolution of the silicon oxide $SiO_2$ layer 3 and/or 4. In this case a heterostructure of the "UTBOX" type referenced as 6' is obtained, the oxide layer(s) of which is(are) reduced in thickness and referenced as 3' and 4'. The active layer 14' is thicker than the initial layer 14.

Figure 4C:
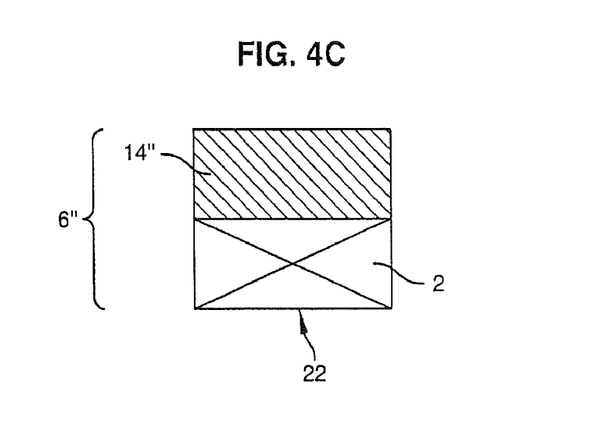

As illustrated in FIG. 4C, the treatment may be continued at temperatures and for durations, such that the oxide layer completely disappears, so that a DSB type substrate 6" is obtained with an even thicker active layer 14".

With the present invention, it is thus possible to trap any kind of contaminants, such as for example gas species (such as hydrogen or another gas), liquid species (such as water), either capable or not of diffusing within the substrate. With the invention, it is also possible to trap organic or metal particles which may be present at the bonding interface.

What is claimed is:

1. A method for manufacturing heterostructures for applications in the fields of electronics, optics or opto-electronics, which comprises:

providing donor and receiver substrates, providing an oxide layer with a thickness of less than or equal to 25 nanometers on one of the donor substrate, the receiver substrate or on both substrates, forming layer trapping through holes inside the oxide by heat treating the substrate(s) that contains the oxide layer for a sufficient time at a temperature between 900° C. and 1,200° C. under a neutral or reducing atmosphere that contains at least one of argon or hydrogen, bonding the substrates together at a bonding interface with the oxide layer(s) positioned between them, reinforcing the bonding by annealing the substrates at a temperature between 25° C. and 500° C. such that the trapping holes retaining gas species at the bonding interface, and transferring an active layer as a portion of the donor substrate onto the receiver substrate to obtain the heterostructure.

2. The method of claim 1, wherein the oxide layer comprises silicon oxide.

3. The method of claim 2, wherein the silicon oxide layer is formed or deposited upon the substrate(s) at a thickness of less than or equal to 10 nanometers.

4. The method of claim 1, wherein the heat treating for forming the trapping holes is carried out by rapid heat annealing for a duration comprised between about 30 seconds and 2 minutes.

5. The method of claim 1, wherein the heat treating for forming the trapping holes is carried out in an epitaxy support for a duration of at least 10 minutes.

6. The method of claim 1, wherein the trapping holes have a diameter of three micrometers at most.

7. The method of claim 1, wherein at least one of the substrates comprises silicon.

8. The method of claim 1, which further comprises etching the substrate(s) containing the silicon oxide layer facing the trapping holes after the heat treating in order to increase trapping hole depth.

9. The method of claim 7, wherein the etching is conducted with hydrochloric acid.

10. The method of claim 1, wherein the oxide layer is obtained by thermal oxidation of the substrate(s) or by chemical vapor deposition or low pressure chemical vapor deposition.

11. The method of claim 1, wherein the oxide layer is a silicon oxide layer deposited by plasma under oxygen.

12. The method of claim 1, wherein the transfer of the active layer comprises forming an embrittlement area inside the donor substrate prior to bonding the substrates together.

13. The method of claim 12, wherein the silicon oxide layer is formed or deposited on the donor substrate and the embrittlement area is formed after the heat treating for forming the trapping holes.

14. The method of claim 1, wherein the active layer has a thickness of between about 25 and 500 nanometers, and which further comprises heating the heterostructure in an inert or reducing atmosphere at a temperature of between about 1,100° C. and 1,300° C. for a time of between about a few minutes and a few hours to reduce the thickness of the oxide layer.

15. The method of claim 1, which further comprises heating the heterostructure until the oxide layer is completely removed such that the active layer directly rests on the receiver substrate.

16. The method of claim 1, wherein the active layer of the heterostructure comprises at least one oxide layer comprising holes for trapping gas species, with the oxide layer having a thickness of less than or equal to 50 nm, and with the trapping holes present in a density of between 0.1 and 100 holes per square centimeter of surface area of the oxide layer and each having a diameter of less than or equal to 3 micrometers.

17. The method of claim 16, wherein the oxide layer of the heterostructure comprises silicon oxide.

* * * * *